United States Patent [19]

Bayer

[11] Patent Number: 5,440,274
[45] Date of Patent: Aug. 8, 1995

[54] PHASE DETECTOR CIRCUIT AND PLL CIRCUIT EQUIPPED THEREWITH

[75] Inventor: Erich Bayer, Ergolding, Germany

[73] Assignee: Texas Instruments Deutschland GmbH, Germany

[21] Appl. No.: 980,822

[22] Filed: Nov. 24, 1992

[51] Int. Cl.⁶ .............................................. H03L 7/06
[52] U.S. Cl. .................................. 331/1 A; 331/17;
      331/27; 331/25; 327/2; 327/3
[58] Field of Search ............... 331/1 A, 1 R, 17, 25,
      331/27; 307/514, 516, 525, 528; 328/133, 134;
      327/2, 3

[56] References Cited

U.S. PATENT DOCUMENTS

| | | | |
|---|---|---|---|
| 3,610,954 | 10/1971 | Treadway | 307/232 |
| 3,614,635 | 10/1971 | La Pine | 331/1 A X |
| 4,122,405 | 10/1978 | Tietz et al. | 331/1 A |
| 4,178,560 | 12/1979 | Maury | 331/1 A |
| 4,322,643 | 3/1982 | Preslar | 307/528 |
| 4,380,083 | 4/1983 | Andersson et al. | 375/120 |
| 4,970,475 | 11/1990 | Gillig | 331/25 |
| 5,072,131 | 12/1991 | Nakano | 307/231 |

FOREIGN PATENT DOCUMENTS

| | | | |
|---|---|---|---|
| 0463243 | 1/1992 | European Pat. Off. | 307/510 |
| 027222 | 2/1985 | Japan. | |
| 101725 | 4/1989 | Japan | 307/514 |
| 980248 | 12/1982 | U.S.S.R. | 328/133 |

Primary Examiner—Robert J. Pascal
Assistant Examiner—Arnold Kinkead
Attorney, Agent, or Firm—William E. Hiller; Richard L. Donaldson

[57] ABSTRACT

A phase detector circuit (10) for generating an analog signal (VR) dependent upon the phase difference between two digital signals (VE, VA) includes two NOR circuits (20, 27) to the inputs (18, 26; 28, 24) of which the two digital signals are supplied on the one hand delayed and negated and on the other directly. The output signals of the NOR circuits (20, 27) control two current sources (S1, S2), one of which in the activated state furnishes a constant charge current (I1) for a storage capacitor (C) whilst the other of which leads a constant discharge current (I2) of equal magnitude away from said storage capacitor (C). The charge voltage at said storage capacitor (C) is an analog signal (VR) which represents a measure of the phase deviation between the digital signals (VE, VA).

4 Claims, 2 Drawing Sheets

PHASE DETECTOR CIRCUIT AND PLL CIRCUIT EQUIPPED THEREWITH

The invention relates to a phase detector circuit for generating an analog signal dependent on the phase difference between two digital signals and to a PLL circuit equipped with such a phase detector circuit.

BACKGROUND OF THE INVENTION

In the processing of digital signals cases arise in which an output signal is required which has a phase position which is exactly coincident with the phase position of an input signal. Fundamentally, for this purpose a phase-lock loop may be used which attempts to keep the output phase always in coincidence with the input phase. An essential part of such a phase-lock loop is a phase detector which generates a control signal in dependence upon the deviation of the output phase from the input phase. Said control signal can then be employed to correct the phase deviation.

From "IEEE Transactions on Consumer Electronics", vol. CE-24, No. 1, February 1978, page 29 et seq., a phase detector is known which can be used in a phase-lock loop. This phase detector has however the disadvantage that it generates an undefined output signal when the phase of the input signal and the phase of the output signal differ only very slightly. This phase detector has a socalled "dead range" in which it does not operate in the manner it should and when used in the phase-lock loop produces disturbances which are referred to as "jitter".

The problem of the "dead range" in a phase detector of the aforementioned type is overcome in a phase-detector circuit which is described in "IEEE Journal of solid-state Circuits, vol. 24, no. 6, June 1989, pages 641 et seq. This known phase detector circuit is used in a control loop in which a certain fixedly predetermined phase offset is generated. This means that the phase-lock loop generates and keeps constant a constant phase difference between the input signal and the output signal corresponding to the phase offset so that the problem of the "dead range", present at very low phase deviations, is no longer encountered. However, such a phase detector cannot always be used because there are cases in which a fixed phase offset between the input signal and the output signal is not acceptable and identical phases must be present.

SUMMARY OF THE INVENTION

The invention is therefore based on the problem of providing a phase detector circuit of the type mentioned at the beginning with the aid of which an offset-free and jitter-free phase control between an input signal and an output signal can be achieved. In a phase detector circuit of the aforementioned type this problem is solved by a first NOR circuit having a first input to which one of the two digital signals is supplied delayed by a predetermined propagation time and inverted, and at least one further input to which the other of the two digital signals is directly supplied, a second NOR circuit having a first input to which the one of the two digital signals is directly supplied and at least one further input to which the other of the two digital signals is supplied delayed by the same predetermined propagation time and inverted, a first constant current source which is controlled by the output signal of the first NOR circuit and which for the duration of said output signal supplies a constant charge current to a storage capacitor, and a second constant current source which is controlled by the output signal of the second NOR circuit and which for the duration of said output signal leads away from the storage capacitor a constant discharge current, the value of which is equal to the value of the charge current furnished by the first constant current source, the charge voltage of the storage capacitor being tappable as the analog signal.

The phase detector circuit according to the invention processes the input signals to be compared in two circuit branches, the output signals of which depend on the phase offset between these two signals and on an additional propagation time delay to which in each case one of the signals is subjected in each of the circuit branches. The output signals then cooperate in the generation of the output signal of the phase detector circuit in opposite sense so that the effects of the deliberately produced propagation time delays are again compensated. With the output signal thus generated a control to the phase offset with the value 0 can be obtained without the aforementioned disadvantages occurring.

BRIEF DESCRIPTION OF THE DRAWINGS

The invention will now be explained by way of example with the aid of the drawings, wherein.

DESCRIPTION OF PREFERRED EMBODIMENTS

Figure 1:
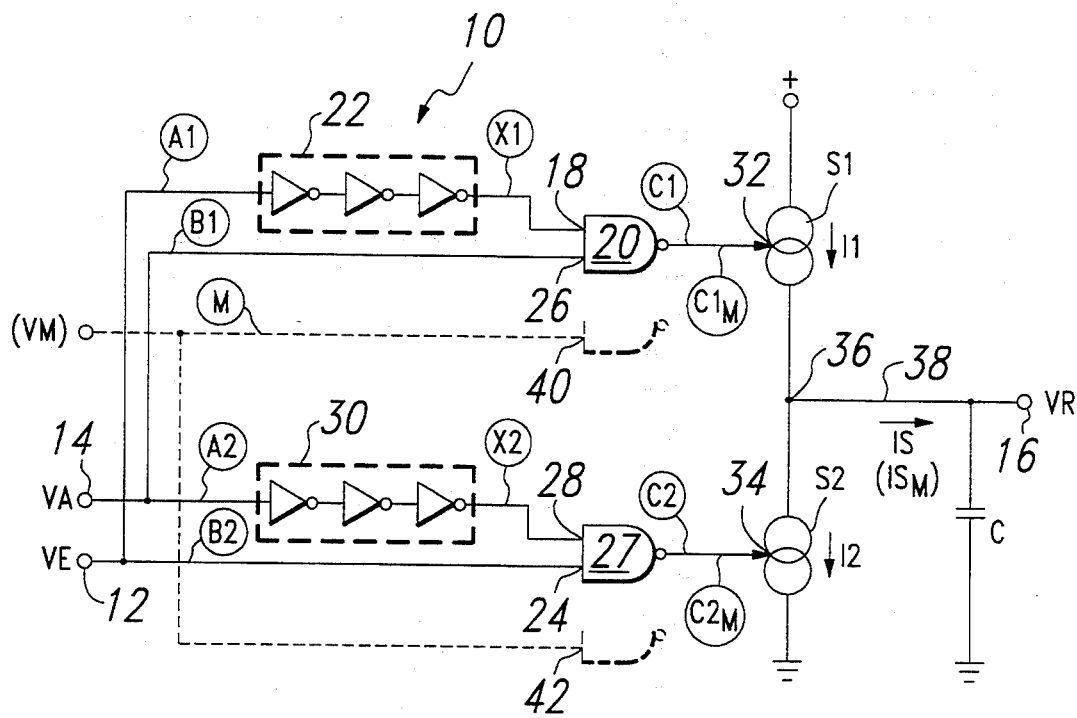
FIG. 1 is a circuit diagram of the phase detector circuit according to the invention.

The phase detector circuit 10 illustrated in FIG. 1 comprises an input 12 for receiving a first digital input signal VE and a further input 14 for receiving a second input signal VA. The phase detector circuit 10 furnishes at an output 16 an analog signal in the form of a voltage VR, the magnitude of which depends on the phase difference between the two input signals VE and VA.

The input signal VE is supplied to a first input 18 of a NOR circuit 20 via a delay member 22 which as apparent in FIG. 1 comprises three inverters connected in series. Due to this structure of the delay member 22 the signal supplied to the input 18 of the NOR circuit 20 is not only delayed with respect to the input signal VE but also inverted.

The input signal VE is also supplied directly to an input 24 of a NOR circuit 27.

The digital input signal VA supplied via the input 14 is supplied to a further input 26 of the NOR circuit 20 directly and to an input 28 of the NOR circuit 27 via a further delay member 30 which is made up in the same manner as the delay member 22. This means that the input signal VA as supplied to the input 28 of the NOR circuit 27 is not only delayed but also inverted.

The delay of the signals supplied to the inputs 18 and 28 caused by the delay members 22 and 30 is in each case τ.

The NOR circuits 20 and 27 of course always emit a signal with the high signal value only when the signals at their inputs both have the low signal value. With the aid of the output signals of the two NOR circuits 20, 27 two current sources S1 and S2 are controlled in such a manner that said current sources are active only whenever they receive at their control inputs 32 and 34 a signal with the high signal value. In the activated state the current source S1 supplies to the circuit point 36 a constant current I1 whilst in the activated state the current source S2 leads a constant current I2 of the same magnitude away from said circuit point 36. Thus, in the output line 38 the sum current IS=I1−I2 flows to a storage capacitor C. The charge voltage at the capacitor C can be tapped at the output 16 as output voltage VR.

In the subsequent description of the mode of operation of the phase detector circuit of FIG. 1 reference will be made to FIG. 2 in which the profile of the signals at the individual points of the circuit is illustrated for three cases, i.e. for the case where the phase of the input signal VE lags behind the phase of the input signal VA by $\Delta\phi$, for the case where these two input signals have the same phase and for the case where the phase of the input signal VE leads the phase of the input signal VA by $\Delta\phi$.

Figure 2:
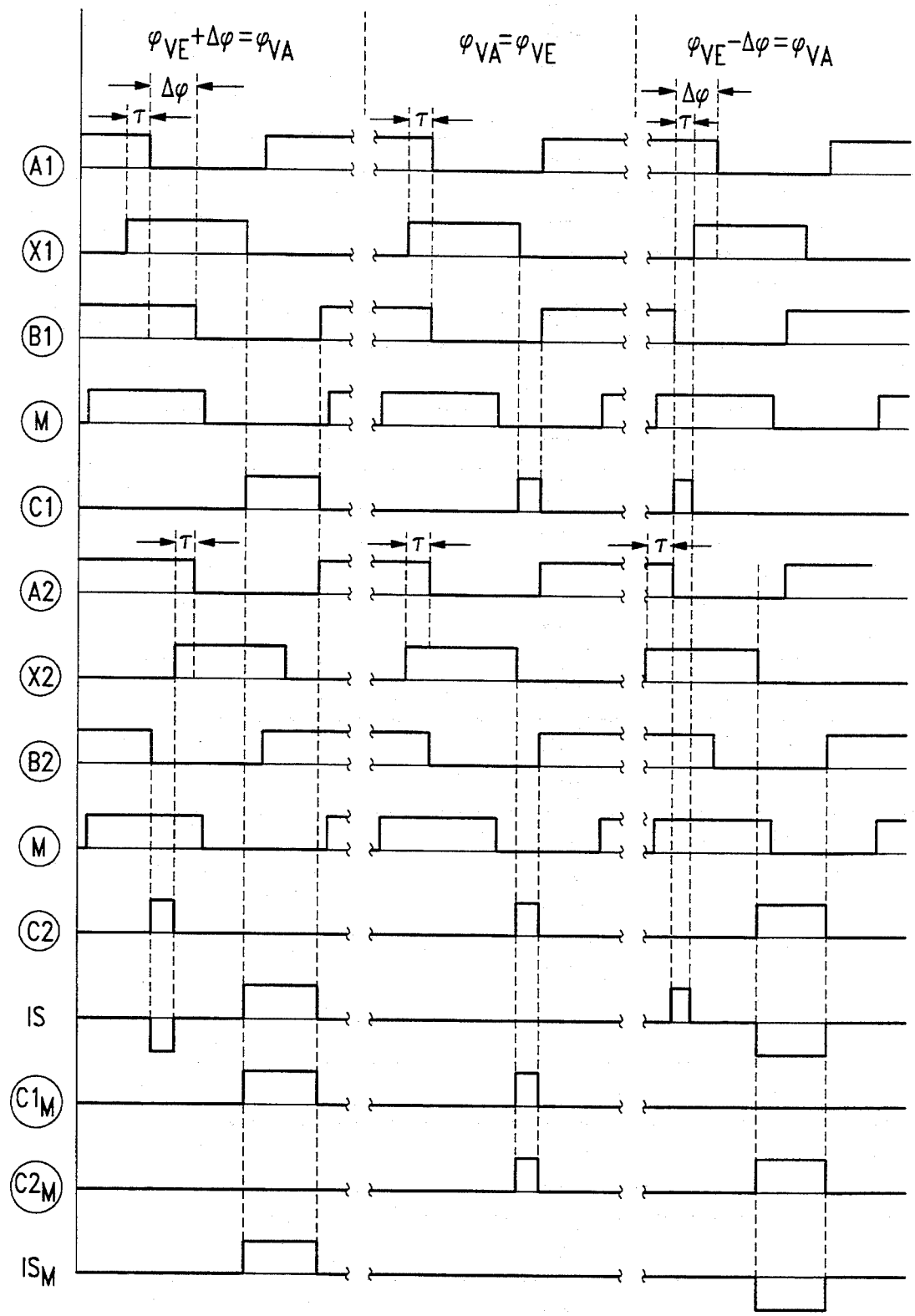
FIG. 2 shows diagrams illustrating the profile of the signals at various points of the circuit of FIG. 1.

In the circuit diagram of FIG. 1 and in the diagram of FIG. 2 the circuit points referred to are indicated with the same designations.

Firstly, the case will be considered where the phase of the input signal VE lags behind the phase of the input signal VA by $\Delta\phi$. As is apparent, the input signal VE present at the line A1 appears delayed by $\tau$ and inverted at the line X1 due to the effect of the delay member 22. At the line B1 the input signal VA is present so that the inputs 18 and 26 of the NOR circuit 20 are supplied with the signals on the line X1 and on the line B1. Thus, on the line C1 a signal with the high signal value occurs as the output signal of the NOR circuit 20 whenever both the signal at the line X1 and the signal at the line B1 have a low signal value. The current source S1 is thus activated for the duration of the output signal on the line C1 and consequently for this period of time furnishes the current I1 to the circuit point 36.

The inputs 28 and 24 of the NOR circuit 27 are supplied with the same input signals but in converse association, i.e. in this case the signal VA is delayed by $\tau$ by the delay member 30 and inverted whilst the signal VE is applied directly to the NOR circuit 27. Thus, at the line C2, likewise only for the duration for which both input signals have the low signal value, an output signal with high signal value occurs which activates the current source S2. For the duration of this activation the current source S2 derives the current I2 from the circuit point 36. It should be observed that the current sources S1 and S2 are so constructed that the currents I1 and I2 have the same magnitude.

The sum current IS indicated in the diagram of FIG. 2 thus results at the line 38 and effects a charging of the capacitor because the duration of the current I1 furnished by the current source S1 is longer than the duration of the current I2 derived by the current source S2.

In the event of phase identity of the input signals VE and VA, at the lines C1 and C2 signals of the same duration result so that the current sources S1 and S2 are each activated for the same duration. As a result, the sum current IS is reduced to zero and consequently no charge current is supplied to the capacitor C and no discharge current derived therefrom.

In the event of the phase of the input signal VE leading the phase of the input signal VA, on the lines C1 and C2 signals arise which result in the current source S1 being activated for a shorter period than the current source S2. This makes the sum current IS negative and that finally leads to a discharge of the capacitor C.

The output voltage VR obtained in the three different cases is thus always exactly a measure of the phase difference between the phases of the input voltages VE and VA. Under the condition that the circuit branches with the delay member 22 and NOR circuit 20 on the one hand and the delay member 30 and the NOR circuit 27 on the other hand as well as the current sources S1 and S2 are respectively adapted exactly to each other and have the same properties, with the output signal VR generated a very exact control of the phase of the input signal VE with respect to the phase of the input signal VA can be achieved. This applies in particular in the critical range as well in which the two signals have the same phase position. This matching of the circuit branches and current sources can readily be achieved when the phase detector circuit is made in the form of an integrated circuit because then when using the same process parameters during the fabrication the desired identical properties of the components of the circuit are obtained.

A modification of the phase detector circuit of FIG. 1 results if instead of the NOR circuits 20 and 27 each having two inputs NOR circuits having three inputs are employed. To the third inputs 40, 42 of said NOR circuits a signal VM is applied which is phase-displaced through 180° with respect to the input signal VE. When using this modification, in the case of phase lead and in the case of phase lag only one of the two current sources S1 or S2 is active. When using the circuit in a phase-lock loop the locking of the phase of the output signal to the phase of the input signal takes place only at the negative edges of the input signal. In the diagram of FIG. 2 the additional signal VM on the line M is shown and the output signals on the lines C1 and C2 are illustrated (each denoted by the index M). The sum current $IS_M$ resulting when this additional signal VM is employed can also be seen.

Figure 3:
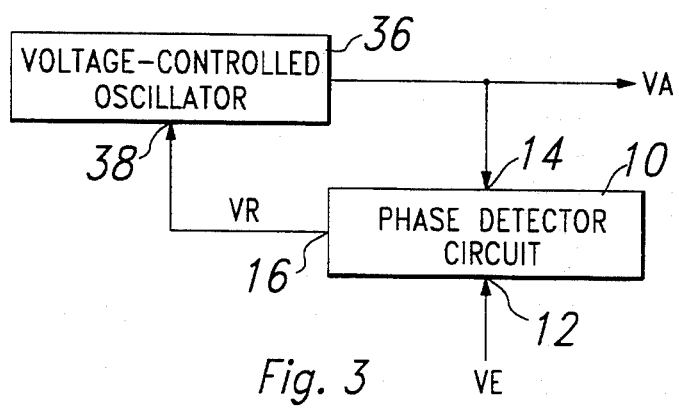
FIG. 3 is an example of a PLL circuit having a phase detector according to the invention.

In FIG. 3 the principle of a PLL circuit in which the phase detector circuit described can be used is illustrated. This PLL circuit contains a voltage-controlled oscillator 36 which is frequently referred to in the literature as VCO. This voltage-controlled oscillator generates the output signal VA, the phase of which is to be controlled to follow the phase of the input signal VE. The phase detector circuit 10 receives at its input 14 the output signal VA of the oscillator 36 and at the input 12 the input signal VE. The output signal VR at the output 16 of the phase detector circuit 10 is supplied to the input 28 of the oscillator 36. Since the output signal VR is a measure of the phase displacement between the signals VA and VE, the voltage-controlled oscillator 36 can always be set so that its output signal VA coincides in the phase position with the input signal VE.

What is claimed is:

1. A phase detector circuit for generating an analog output signal dependent upon the phase difference between two digital input signals, said phase detector circuit comprising:
   a first input terminal for receiving a first digital input signal;
   a second input terminal for receiving a second digital input signal independent of the first digital input signal as received by said first input terminal;
   first and second delay numbers respectively connected to said first and second input terminals for receiving the first digital input signal and the second digital input signal and providing first and second digital signals delayed by the same predetermined propagation time;

first and second logic circuits having at least two inputs and an output;

the first input of each of said logic circuits being respectively connected to the output of the one of said first and second delay numbers corresponding thereto;

the second input of said first logic circuit being connected to said second input terminal;

the second input of said second logic circuit being connected to said first input terminal;

first and second constant current sources respectively connected to the outputs of said first and second logic circuits;

said first and second constant current sources being connected together;

a node;

an output terminal;

said node being disposed in the connection between said first and second constant current sources and being connected to said output terminal;

a capacitor having one side connected between said node and said output terminal and the other side connected to ground;

said first constant current source being responsive to the output signal of the first logic circuit to provide a constant charge current to said capacitor over the duration of said output signal of the first logic circuit;

said second constant current source being responsive to the output signal of the second logic circuit to cause a constant discharge current from said capacitor over the duration of said output signal of the second logic circuit and of a magnitude equal to the constant charge current provided by said first constant current source;

the constant charge current from said first constant current source and the constant discharge current from said capacitor producing a sum current supplied to said capacitor, the sum current supplied to said capacitor being dependent upon the relative durations of the output signals of said first and second logic circuits and being zero when the durations of said output signals are the same; and the charge voltage of said capacitor being tappable as the analog output signal representative of the phase difference between the phases of the first and second digital input signals and being zero when the first and second digital input signals have phase identity.

2. A phase locked loop circuit comprising:

a phase-controlled oscillator;

a phase detector circuit for generating an analog output signal dependent upon the phase difference between two digital input signals;

said phase-controlled oscillator being connected to the output of said phase detector circuit and being controlled by the analog output signal provided thereby; and said phase-controlled oscillator and said phase detector circuit being connected in a phase-locking loop in which said phase-controlled oscillator generated an output signal in response to the analog output signal from said phased detector circuit as received by said phase-controlled oscillator;

said phase detector circuit including a first input terminal for receiving a first digital input signal, a second input terminal for receiving the output signal as generated by said phase-controlled oscillator as a second digital input signal independent of the first digital input signal as received by said first input terminal, first and second delay members respectively connected to said first and second input terminals for receiving the first digital input signal and the second input signal and providing first and second digital signals delayed by the same predetermined propagation time, first and second logic circuits having at least two inputs and an output, the first input of each of said logic circuits being respectively connected to the output of the one of said first and second delay members corresponding thereto, the second input of said first logic circuit being connected to said second input terminal, the second input of said second logic circuit being connected to said first input terminal, first and second constant current sources respectively connected to the outputs of said first and second logic circuits, said first and second constant current sources being connected together, a node, an output terminal, said node being disposed in the connection between said first and second constant current sources and being connected to said output terminal, a capacitor having one side connected between said node and said output terminal and the other side connected to ground, said first constant current source being responsive to the output signal of the first logic circuit to provide a constant charge current to said capacitor over the duration of said output signal of the first logic circuit, said second constant current source being responsive to the output signal of the second logic circuit to cause a constant discharge current from said capacitor over the duration of said output signal of the second logic circuit and of a magnitude equal to the constant charge current provided by said first constant current source, the constant charge current from said first constant current source and the constant discharge current from said capacitor producing a sum current supplied to said capacitor, the sum current supplied to said capacitor being dependent upon the relative durations of the output signals of said first and second logic circuits and being zero when the durations of said output signals are the same, and the charge voltage of said capacitor being tappable as the analog output voltage of said phased detector circuit which is representative of the phase difference between the phases of the first and second digital input signals and being zero when the first and second digital input signals have phase identity.

3. A phase detector circuit for generating an analog output signal dependent upon the phase difference between two digital input signals, said phase detector circuit comprising:

a first input terminal for receiving a first digital input signal;

a second input terminal for receiving a second digital input signal independent of the first digital input signal as received by said first input terminal;

first and second delay numbers respectively connected to said first and second input terminals for receiving the first digital input signal and the second digital input signal and providing first and second inverted digital signals delayed by the same predetermined propagation time;

first and second NOR logic circuits having two inputs and an output;

the first input of each of said NOR logic circuits being respectively connected to the output of the one of said first and second delay members corresponding thereto;

the second input of said first NOR logic circuit being connected to said second input terminal;

the second input of said second NOR logic circuit being connected to said first input terminal;

first and second constant current sources respectively connected to the outputs of said first and second NOR logic circuits;

said first and second constant current sources being connected together;

a node;

an output terminal;

said node being disposed in the connection between said first and second constant current sources and being connected to said output terminal;

a capacitor having one side connected between said node and said output terminal and the other side connected to ground;

said first constant current source being responsive to the output signal of the first NOR logic circuit to provide a constant charge current to said capacitor over the duration of said output signal of the first NOR logic circuit;

said second constant current source being responsive to the output signal of the second NOR logic circuit to cause a constant discharge current from said capacitor over the duration of said output signal of the second NOR logic circuit and of a magnitude equal to the constant charge current provided by said first constant current source;

the constant charge current from said first constant current source and the constant discharge current from said capacitor producing a sum current supplied to said capacitor, the sum current supplied to said capacitor being dependent upon the relative durations of the output signals of said first and second NOR logic circuits and being zero when the durations of said output signals are the same; and the charge voltage of said capacitor being tappable as the analog output signal representative of the phase difference between the phases of the first and second digital input signals and being zero when the first and second digital input signals have phase identity.

4. A phase detector circuit as set forth in claim 3, wherein each of said first and second NOR circuits is provided with a third input for receiving a signal derived from one of said first and second digital input signals and phase displaced through 180° with respect thereto.

* * * * *